(12) United States Patent
Yin et al.

(10) Patent No.: US 6,650,013 B2
(45) Date of Patent: Nov. 18, 2003

(54) METHOD OF MANUFACTURING WIRE BONDED MICROELECTRONIC DEVICE ASSEMBLIES

(75) Inventors: Leng Nam Yin, Singapore (SG); Lim Thiam Chye, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/943,897

(22) Filed: Aug. 30, 2001

(65) Prior Publication Data

US 2003/0049882 A1 Mar. 13, 2003

(30) Foreign Application Priority Data

Aug. 29, 2001 (SG) .......................... 200105302

(51) Int. Cl.[7] .......................... H01L 23/48; H01L 23/52; H01L 29/40
(52) U.S. Cl. .................... 257/736; 257/734; 257/735; 257/738; 257/782; 257/781; 257/784
(58) Field of Search ................ 257/730, 736, 257/737, 738, 777, 778, 735, 782, 783, 784, 780, 781; 438/106, 107, 8

(56) References Cited

U.S. PATENT DOCUMENTS

| | | | |
|---|---|---|---|
| 5,291,019 A | * | 3/1994 | Powell et al. ............. 250/338.4 |
| 5,735,030 A | | 4/1998 | Orcutt |
| 5,844,317 A | | 12/1998 | Bertolet et al. |
| 5,930,666 A | * | 7/1999 | Pankove ..................... 438/615 |
| 5,960,262 A | | 9/1999 | Torres et al. |
| 6,012,224 A | | 1/2000 | DiStefano et al. |
| 6,062,462 A | | 5/2000 | Gillotti et al. |
| 6,110,823 A | | 8/2000 | Eldridge et al. |
| 6,143,396 A | | 11/2000 | Saran et al. |
| 6,155,474 A | | 12/2000 | Orcutt |
| 6,182,882 B1 | | 2/2001 | Hortaleza et al. |
| 6,232,662 B1 | | 5/2001 | Saran |
| 6,268,662 B1 | * | 7/2001 | Test et al. .................... 257/784 |
| 6,373,273 B2 | * | 4/2002 | Akram et al. ............... 324/765 |

FOREIGN PATENT DOCUMENTS

| | | |
|---|---|---|
| EP | 0 753 891 A2 | 1/1997 |
| WO | WO 02/082527 A1 | 10/2002 |

OTHER PUBLICATIONS

Gold Bump Images—MicroFab Technology, *Electroplating—Gold Bumps*, MicroFab Technology 2001, Aug. 17, 2001, 2 pages, <http://www.microfabtech.com/goldbump-images.html>.

(List continued on next page.)

*Primary Examiner*—Amir Zarabian
*Assistant Examiner*—Khanh Duong
(74) *Attorney, Agent, or Firm*—Perkins Coie LLP

(57) ABSTRACT

Aspects of the invention provide microelectronic device assemblies including microelectronic components wire bonded to substrates, and methods of forming such assemblies. In one embodiment of the invention, a microelectronic component includes a plurality of multi-layered bond pads. Each of the multi-layered bond pads includes a bond pad base (which may comprise aluminum), an outer bond layer (which may comprise gold), and an intermediate layer between the bond pad base and the outer bond layer. This microelectronic component may be wire bonded to a substrate, with the outer bond layer and the bonding wire both comprising the same metal (e.g., gold). The bonding wire may be reliably stitch bonded to the outer bond layer of the multi-layered bond pads, facilitating manufacture of low profile microelectronic device assemblies.

45 Claims, 4 Drawing Sheets

OTHER PUBLICATIONS

Gold Bump Design—MicroFab Technology, *Electroplating—Gold Bumps*, MicroFab Technology 2001, Aug. 17, 2001, 2 pages, <http://www.microfabtech.com/goldbump-design.html>.

Wafer Bumping—Gold Bumps—MicroFab Technology, *Electroplating—Gold Bumps*, MicroFab Technology 2001, Aug. 17, 2001, 2 pages, <http://www.microfabtech.com/goldbumps.html>.

K&S /Products & Services/Premium Processes, *Premium Process Capability*, 2001 Kulicke & Soffa, Aug. 17, 2001, 6 pages, <http://www.kns.com/prodserv/process/premium-process-matrix.asp>.

Process Users Guide, *BGA4 CD Loop Process Profile*, Kulicke and Soffa Industries, Inc., May 15, 2001, 17 pages.

Process Users Guide, *Stand–off Stitch Bond (SSB–1)*, Kulicke and Soffa Industries, Inc., Jul. 12, 2001, 16 pages.

Ivy Wei Qin, Paul Bereznycky and Dave Doerr, *Wedge Bonding for Ultra Fine Pitch Applications*, Kulicke & Soffa, Willow Grove, PA, USA, originally presented at Semicon Singapore 2001, Aug. 18, 2001, 10 pages.

K&S/Resources, Beni Nachon, *Basics of Ball Bonding*, 2001 Kulicke & Soffa, Aug, 18, 2001, 13 pages, <http://www.kns.com/resources/articles/ballbondcapillaries.asp>.

SPT, Basics of Ball Bonding Process, *The Basic Gold Ball Wire Bonding Cycle* brochure, date unknown, 4 pages.

* cited by examiner

METHOD OF MANUFACTURING WIRE BONDED MICROELECTRONIC DEVICE ASSEMBLIES

This application claims foreign priority benefits of Singapore Application No. 200105302-4, which was filed Aug. 29, 2001.

TECHNICAL FIELD

The present generally relates to techniques for interconnecting microelectronic components. The invention has particular utility in connection with wire bonding microelectronic components.

BACKGROUND

A variety of techniques are known for interconnecting microelectronic components, such as when electrically coupling a semiconductor die to a substrate. These techniques include wire bonding, tape automated bonding (TAB) and flip chip bonding. In wire bonding, a bond pad on a microelectronic component is attached to a contact on a substrate or other microelectronic component. In forming the wire bond, a bonding wire is fed through a capillary which is guided under computer control. A free air ball of molten wire will be formed at the tip of the wire. This free air ball will then be pressed against the bond pad of the microelectronic component or the contact of the substrate, forming a "ball bond." Most commonly, the ball bond is formed on the bond pad of the microelectronic component rather than on the contact of the substrate. The capillary is then guided upwardly to a predetermined height and the wire is kinked before it is bent and guided to be joined to the substrate. The second end of the bonding wire is typically attached to the contact of the substrate using a "stitch bond." In a stitch bond, ultrasonic energy is delivered to the wire through the capillary as the capillary presses the wire against the contact of the substrate. A bonding head carrying the capillary is retracted to leave a wire tail at the stitch. Thereafter, a wire clamp carried by the bonding head is closed, tearing the wire as the bonding head retracts further. Thereafter, the same process may be repeated to wire bond two different locations. U.S. Pat. No. 6,110,823 (the entirety of which is incorporated herein by reference) provides a detailed discussion of many aspects of wire bonding operations.

Ball bonding requires that a predetermined length of the wire extend outwardly away from the ball bond before the wire is bent. If the wire is bent too close to the location of the ball bond, the ball bond joint will be stressed and can fail. To avoid such failures, the wire must have a minimum "loop height" (commonly about 6 mils or greater) measured from the location of the ball bond up to the top of the wire where it is bent.

In conventional chip-on-board (COB) structures, a semiconductor chip or other microelectronic component may be attached to a substrate with the active surface of the microelectronic component facing outwardly away from the substrate. The back surface of the microelectronic component is adhesively bonded to the substrate. The bond pads on the microelectronic component may then be wire bonded to contacts arranged on the surface of the substrate to electrically couple the microelectronic component to the substrate. If the bonding wire is ball bonded to the bond pads of the microelectronic component, the wire will have to extend outwardly away from the active surface of the microelectronic component at least the minimum loop height before it can be angled downwardly and stitch bonded to the contact of the substrate. This can materially increase the overall height or profile of the microelectronic device assembly.

The bonding wire may extend laterally outwardly away from a stitch bond rather than generally perpendicularly outwardly, as is the case in a ball bond. The minimum height of a stitch bond, consequently, can be significantly smaller than a ball bond, being limited primarily by the thickness of the bonding wire. The total height of a microelectronic device assembly can be reduced if the bonding wire is ball bonded to the contact of the substrate then stitch bonded to the bond pad on the microelectronic component because the bond wire can extend vertically upwardly the entire thickness of the microelectronic component before being bent. Since most microelectronic components are significantly thicker than the minimum loop height for a stable ball bond, this avoids any undue stress on the ball bond.

Stitch bonding a wire directly to a bond pad on a microelectronic component can be problematic, though. The stress on a microelectronic component is relatively low during ball bonding operations because the molten ball which is pushed into contact with the bond pad can flow outwardly to create the "nail head" without placing undue stress on the bond pad itself. The bond pads and integrated circuitry of semiconductor chips are most commonly formed of aluminum, though copper is gaining increased acceptance. Most bonding wires are formed of gold. To get a strong metallurgical bond between the gold bond wire and aluminum bond pad, for example, sufficient compression force and ultrasonic energy must be applied with the capillary to form gold-aluminum intermetallics. This places a lot of stress on the aluminum bond pad, which may damage the bond pad or the underlying circuitry.

FIGS. 1 and 2 schematically illustrate one current technique used to minimize the problems associated with stitch bonding to an aluminum bond pad of a semiconductor die. In this technique, conventionally referred to as "stand-off stitch bonding" (SSB), the wire 4 is not directly stitch bonded to the bond pad 2 of the die 1. Instead, a ball bump 3 is first applied to the bond pad 2. A short length 5 of the bonding wire 4 is then stitch bonded to the ball bump 3. The ball bump 3 is usually formed as an extra step in the wire bonding process. A free air ball of molten metal will be formed at the end of the wire and the ball will be pressed against the bond pad 2 using the capillary. Rather than continuing to feed the wire as the capillary moves toward the second connection, the bonding wire is torn just at the top of the ball bond, leaving a coined ball bump 3 on the bond pad 2. The wire is then extended, the tip is melted to form a new free air ball, and the wire is ball bonded to the contact on the substrate (not shown in FIGS. 1 and 2). The wire is then fed through the capillary as it moves back over the ball bump 3 and the capillary stitch bonds the wire 4 directly to the top of ball bump 3.

Wire bonding equipment is often a bottleneck in the production of a microelectronic device assembly because a length of bonding wire must be separately attached to two different locations to create a single electrical connection between the die 1 and the substrate. Dies often have many bond pads which require wire bonding, with some dies requiring hundreds of separate wire bonds. Whereas conventional wire bonding requires two separate bonds for every wire, SSB requires that the capillary first formed a ball bump 3 before beginning the wire bonding process. This in essence requires the formation of three distinct bonds for each bonding wires, which can significantly add to the processing time required in a wire bonding operation.

SSB also requires very high precision in positioning the bonding wire 4 to form the stitch bond 5. The width $W_B$ of the ball bump 3 is generally correlated to the diameter of the bonding wire 4. As suggested in FIGS. 1 and 2, the ball bump 3 can be significantly smaller than the total available surface area of the bond pad 2. This reduces the room for potential error in positioning the wire with respect to the bond pad 2 to form the stitch bond 5.

DETAILED DESCRIPTION

Figure 1:
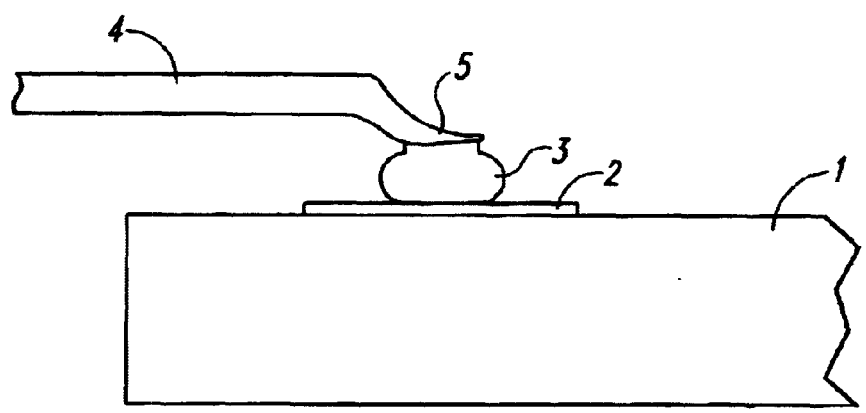
FIG. 1 is a schematic side elevation view of a conventional stand-off stitch bond.

Various embodiments of the present invention provide microelectronic devices and methods for forming such devices. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

Figure 3:
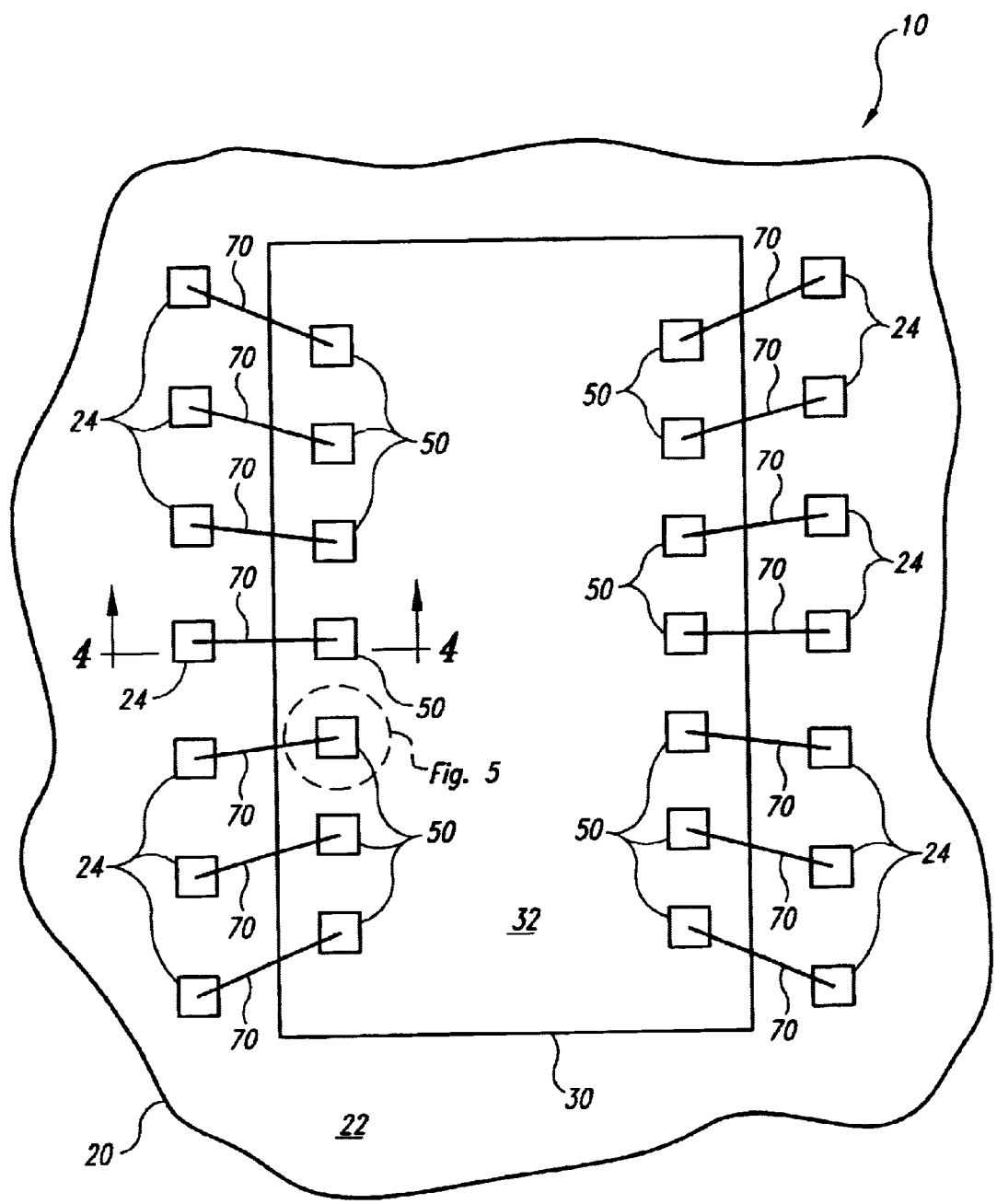
FIG. 3 is a schematic top elevation view of a microelectronic device assembly in accordance with one embodiment of the present invention.
Figure 4:
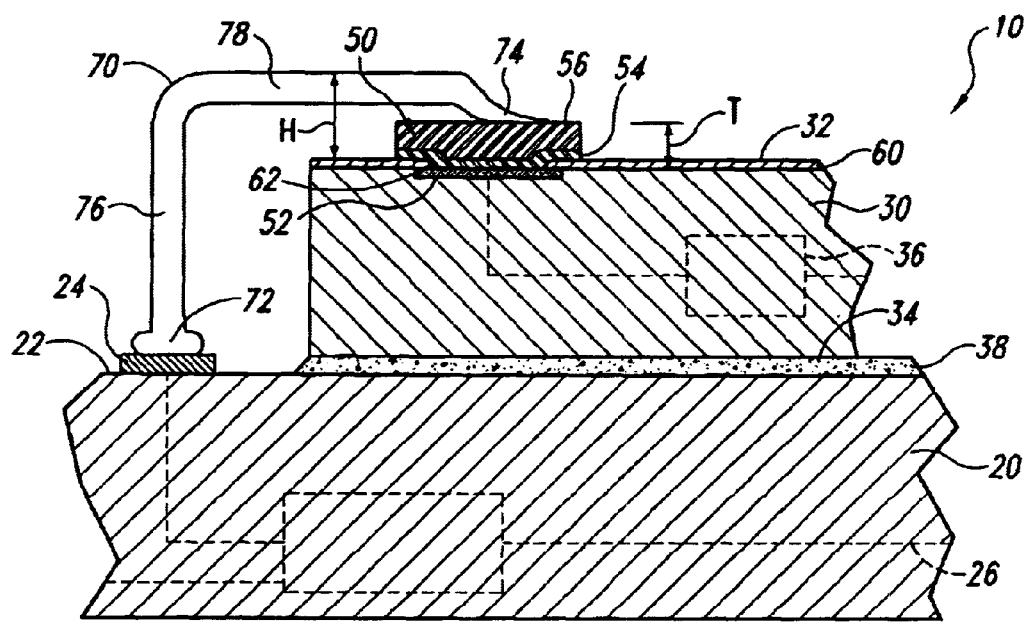
FIG. 4 is a schematic cross-sectional view taken along line 4—4 of FIG. 3.
Figure 5:
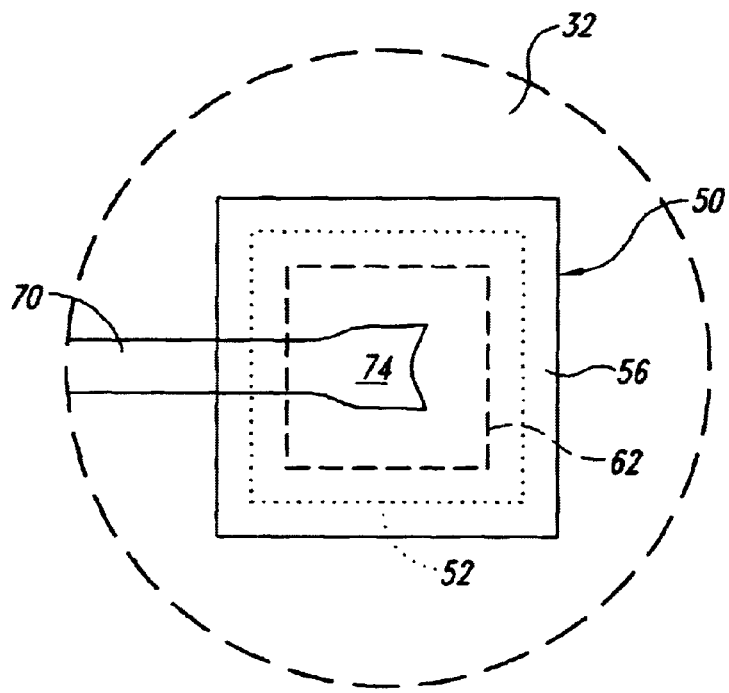
FIG. 5 is a top isolation view of a portion of the microelectronic device assembly shown in FIG. 3.

FIGS. 3–5 schematically illustrate a microelectronic device assembly 10 in accordance with one embodiment of the invention. This microelectronic device assembly 10 includes a microelectronic component 30 carried by a substrate 20. The substrate 20 has a plurality of electrical contacts 24 carried on a contact surface 22. Electrical circuitry (shown schematically as element 26 in FIG. 4) within the substrate 20 may be electrically coupled to each of the contacts 24. The substrate 20 may be flexible or rigid and have any desired configuration. The substrate 20 may be formed of materials commonly used in microelectronic substrates, such as ceramic, silicon, glass, or combinations thereof. Alternatively, the substrate 20 may be formed of an organic material or other materials suitable for printed circuit boards (PCBs). In one embodiment of the invention, the substrate 20 comprises a printed circuit board such as an FR-4 or FR-5 PCB.

The microelectronic component 30 has an active surface 32 (i.e., the front surface) and a back surface 34. The active surface 32 bears a plurality of multi-layer bond pads 50 exposed adjacent the active surface 32. The microelectronic component 30 may be a digital signal processor (DSP), a logic chip, DRAM, flash-memory, a processor, or any of a variety of other types of microelectronic devices. Typically, the microelectronic component 30 may comprise a silicon die carrying integrated circuitry (shown schematically as element 36 in FIG. 4). Although the microelectronic component 30 is illustrated in the drawings as being a single element, it should be understood that the microelectronic component 30 can comprise any number of subcomponents.

The microelectronic component 30 may be attached to the substrate 20 in any desired fashion. In one embodiment, the microelectronic component 30 is attached to the contact surface 22 of the substrate 20 by an adhesive 38. The adhesive 38 may be an epoxy, a thermoplastic material, a polymeric tape, a polymeric tape coated with a thermoplastic material, or any other conventional adhesive or cementitious material compatible with the materials of the substrate 20 and the microelectronic component 30 and stable in the anticipated conditions of manufacture and use.

The active surface 32 of the microelectronic component 30 may include a passivation layer 60 having a plurality of openings 62 therein. Each of the openings 62 is associated with one of the bond pads 50. The passivation layer 60 may help protect the underlying silicon and integrated circuitry from attack by moisture and the like. For example, the passivation layer 60 may be a relatively thin layer of silicon nitride which acts as a moisture barrier and may also provide abrasion resistance. Each of the bond pads 50 may have a multi-layered structure including a bond pad base 52, an intermediate layer 54 and an outer bond layer 56. The bond pad base 52 may comprise a conventional bond pad. If the microelectronic component 30 is a semiconductor die bearing an integrated circuit, the bond pad base 52 will commonly be formed of the same metal used to form the integrated circuitry 36. Most commonly, such circuits 36 and the bond pad base 52 may be formed of aluminum or copper. In one particular embodiment of the invention, the bond pad base 52 comprises aluminum. The bond pad base 52 need not be formed of pure aluminum or pure copper. If so desired, the aluminum or copper may be alloyed with other metals to improve properties as is known in the art.

The bond pad base 52 may have an outer periphery which extends beyond the interior of the opening 62 in the passivation layer 60. The passivation layer 60 can hinder bonding a wire or other metal to the underlying bond pad base 52. This can limit the effective surface area of the bond pad base 52 to the area exposed within the opening 62 of the passivation layer 60.

The outer bond layer 56 of the bond pad 50 is formed of a conductive material which will form a stable physical and electrical connection with the bonding wire 70. In one embodiment of the invention, the outer bond layer 56 comprises a metal suitable for use as a bonding wire 70. In particular, the outer bonding layer 56 and the bonding wire 70 may comprise the same metal. Most bonding wires 70 in conventional use today comprise gold and the outer bonding layer 56 may also comprise gold. This gold may be alloyed with minor amounts of other metals to adjust the material properties of the outer bond layer 56 and/or the bonding wire 70. The composition of the outer bond layer 56 and the bonding wire 70 need not be identical. For example, the outer bond layer 56 may consist essentially of gold while the bonding wire 70 may comprise gold alloyed with minor amounts of other metals to improve wire properties. In an alternative embodiment wherein the bonding wire 70 comprises copper, the outer bond layer 56 may also comprise copper.

The intermediate layer 54 serves to physically join and electrically couple the bond pad base 52 and the outer bond layer 56. The intermediate layer 54 may comprise a conductive metal which is compatible with the material of the bond pad base 52 and the material of the outer bond layer 56. In one embodiment of the invention, the intermediate layer comprises a metal which promotes adhesion of the outer bond layer 56 to the bond pad base 52 and may also limit diffusion of the metal of the outer bond layer 56 into the bond pad base 52 and/or diffusion of the metal of the bond pad base 52 into the outer bond layer 56. Toward this end, the intermediate layer 54 may be formed of the same types of materials conventionally used as underlying bump materials in wafer bumping flip chips. Suitable materials for the intermediate layer 54 include, but are not limited to, titanium, tungsten, chromium, and alloys of titanium, tungsten, or chromium.

The thickness T of the combined intermediate layer 54 and outer bond layer 56 of the bond pad 50 may be controlled to control the maximum height H which the bonding wire 70 extends outwardly from the active surface 32 of the microelectronic component 30. This thickness T should be large enough to mitigate any deleterious impact of the stitch bonding process (discuss below) on the bond pad base 52. In one embodiment, the combined thickness T of the intermediate layer 54 and the outer bond layer 56 is no greater than one mil (25.4 $\mu$m). In one exemplary embodiment, the thickness T is about 0.8 mils (about 20 $\mu$m). The relative thickness of the intermediate layer 54 and the outer bond layer 56 can be adjusted as desired, but it is anticipated that the outer bond layer 56 will be significantly thicker than the intermediate layer 54 for most applications.

The intermediate layer 54 and the outer bond layer 56 may be applied in any of a variety of fashions, including stenciling, chemical vapor deposition (CVD), physical vapor deposition (PVD), and electroplating. All of these techniques are well known in the art of semiconductor manufacture and need not be discussed in detail here. By way of example, though, the intermediate layer 54 may be deposited on the entire active surface 32 of the microelectronic component 30 via conventional CVD or PVD techniques, creating a conductive layer which spans the entire active surface 32. This entire structure may be coated with a photoresist which is patterned to create openings down to the intermediate layer, with the openings defining the boundaries of the outer bond layer 56 to be applied. The outer bond layer 56 may then be electroplated onto the exposed surface of the intermediate layer 54 above the base 52 of each bond pad 50. The photoresist may then be stripped, exposing excess metal of the intermediate layer 54 which is not covered by the outer bond layer 56. This excess metal of the intermediate layer 54 may then be etched, leaving a multi-layer bond pad 50 generally as illustrated in FIG. 4.

The outer bond layer 56 may be coextensive with the effective surface area of the bond pad base 52 and the bond pad 50 may substantially fill the opening 62 in the passivation layer 60. This is not necessary, though, and the outer bond layer 56 may have a surface area which is greater than or less than the effective surface area of the bond pad base 52 and the bond pad 50 substantially fill the opening 62 in the passivation layer 60. In the illustrated embodiment, both the intermediate layer 54 and the outer bond layer 56 have a periphery which extends beyond the periphery of the opening 62 in the passivation layer 60. As a consequence, a peripheral portion of the intermediate and outer bond layers 54 and 56 will overlie and extend outwardly and beyond an outer surface of the passivation layer 60. Hence, each bond pad 50 provides a surface area which is greater than the effective surface area of the bond pad base 52.

Figure 2:
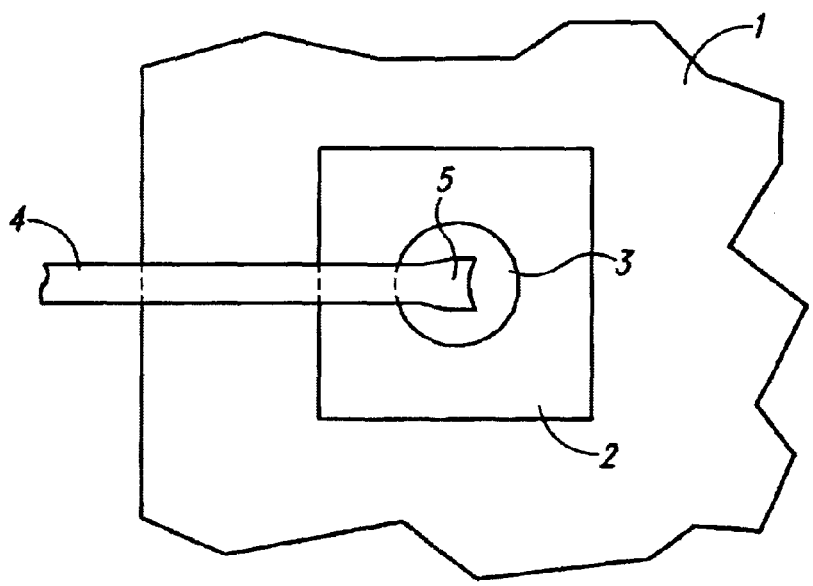
FIG. 2 is a schematic top elevation view of the stand-off stitch bond of FIG. 1.

In SSB operations (discussed above in connection with FIGS. 1 and 2), the stitch bond 5 has to be quite precisely aligned with the relatively small ball bump 3 to ensure proper connection between the bonding wire 4 and the bond pad 2. The size of the ball bump 3 in SSB operations is correlated to the size of the bonding wire 4. The outer bond layer 56 in accordance with the present invention, however, is not so limited and can be substantially larger than such a ball bump 3. The present invention provides significant flexibility in defining the shape and surface area of the outer bond layer 56 of the bond pad 50. This increases tolerances in the wire bonding operation, permitting the stitch bond 74 of the bonding wire 70 to deviate slightly from the exact center of the bond pad base 52 without jeopardizing the adequacy of the physical and electrical connection between the bonding wire 70 and the bond pad 50.

The intermediate layer 54 and outer bond layer 56 of all of the bond pads 50 on the microelectronic component 30 can be applied simultaneously. In one embodiment of the invention, the intermediate layer 54 and outer bond layer 56 are applied to an entire wafer before the wafer is singulated into individual dies for use as the microelectronic components 30. In SSB operations, the wire bonding machine must go through an extra step of adding a ball bump 3 for each and every bonding wire 4, significantly restricting throughput through the wire bonding machine. By depositing the outer bond layer 56 in a large-scale batch operation, this additional step in the wire bonding operation can be eliminated, reducing the likelihood that the wire bonding machine(s) will be a bottleneck in the production of the microelectronic device assemblies 10.

In the illustrated embodiment of the invention, each of the bonding wires 70 is coupled to a separate contact 24 on the substrate 20 via a ball bond 72 and is subsequently attached to one of the bond pads 50 by a stitch bond 74. The first length 76 of the bonding wire 70 may extend directly outwardly from the contact 24 to a height which is at least as great as the entire thickness of the microelectronic component 30 and the adhesive 38. A second length 78 of the bonding wire 70 may extend inwardly toward the bond pad 50 in a lateral direction (which is substantially horizontal in the orientation shown in FIG. 4). The ball bond 72 and the stitch bond 74 may be formed using conventional wire bonding equipment, such as that commercially available from Kulicke and Soffa Industries, Inc. of Willow Grove, Pa., U.S. The stitch bond 74 can be a conventional stitch bond or a wedge bond. Wedge bonds typically bond a longer length of the wire 70 to the bond pad 50 to improve the physical bonding and electrical connection between the bond wire 70 and the bond pad 50. The relatively small size of the ball bump 3 in conventional SSB processes limits the use of wedge bonds.

As noted above, significant compressive force and ultrasonic energy is necessary to stitch bond a gold wire to an aluminum bond pad in conventional stitch bonding. These high energy levels can risk damage to the bond pad or the underlying circuitry. Employing an outer bond layer 56 and a wire 70 which comprise the same metal facilitates formation of a strong metallurgical bond between the bonding wire 70 and the bond pad 50. As a consequence, the capillary of the wire bonder can be pressed against the bond pad 50 with less force, lower ultrasonic levels can be employed, and/or the stitch bonding process can take place at lower temperatures. This reduces the stress of the stitch bonding operations on the bond pad base 52. The presence of the outer bond layer 56, which may be formed of a malleable metal, can also reduce the physical impact of the stitch bonding operation on the bond pad base 52. This facilitates forming stitch bonds between the bonding wire 70 and the microelectronic component 30 which are stronger and less prone to failure without risking damage to the microelectronic component 30 during the stitch bonding operation, enhancing reliability of the final microelectronic device assembly 10.

Figure 6:
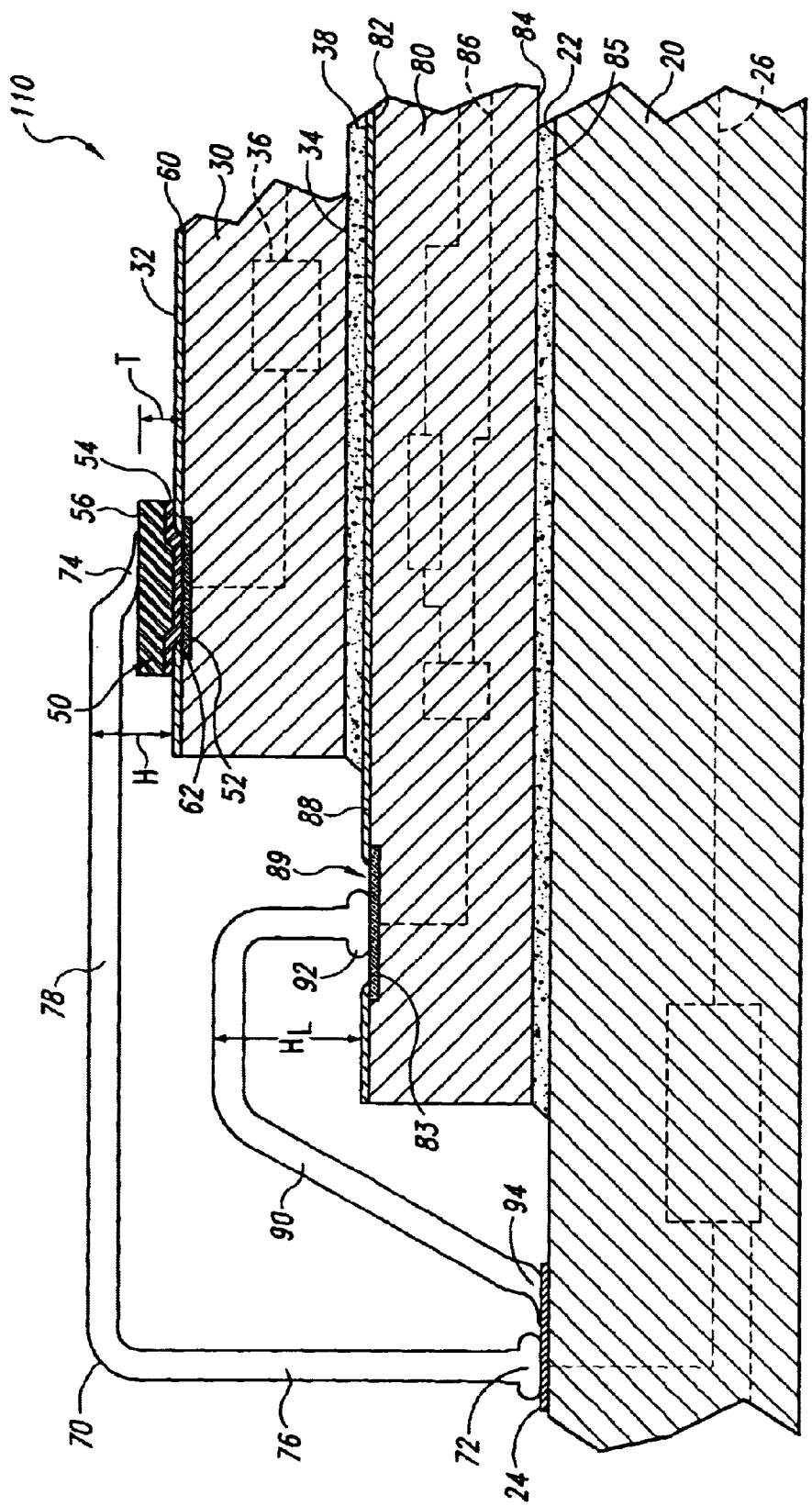
FIG. 6 is a schematic cross-sectional view of a portion of a microelectronic device assembly in accordance with an alternative embodiment of the invention.

FIG. 6 schematically illustrates a different microelectronic device assembly 110 in accordance with an alternative embodiment of the invention. Many of the elements of this microelectronic component 110 may be substantially the same as elements used in the microelectronic component 10 of FIGS. 3–5 and like reference numbers are used for like elements. Hence, the microelectronic device assembly 110 of FIG. 6 includes a first bonding wire 70 which electrically couples a contact 24 of the substrate 20 to a multi-layered bond pad 50 of the microelectronic component 30. In FIG. 6, the microelectronic component 30 is not directly attached to the contact surface 22 of the substrate 20 via an adhesive 38. Instead, a second microelectronic component 80 is interposed between the first microelectronic component 30 and the substrate 20.

The second microelectronic component 80 includes an active surface 82 carrying a plurality of bond pads 83, a back surface 84, and circuitry 86 which may be electrically coupled to the bond pads 83. The back surface 84 of the second microelectronic component 80 may be attached to the contact surface 22 of the substrate 20 by a suitable adhesive 85. Any conventional adhesive material may be used, such as those outlined above in connection with the adhesive layer 38 of FIG. 4. If so desired, the two adhesive layers 38 and 85 may be formed of the same material. In the illustrated embodiment, the adhesive 38 bonds the back surface 34 of the first microelectronic component 30 to a passivation layer 88 carried by the active surface 82 of the second microelectronic component 80. This passivation layer 88 may include a plurality of openings 89, each of which is aligned with a different bond pad 83.

The bond pad 83 of the second microelectronic component 80 may be coupled to a contact 24 on the substrate 20 via a second bonding wire 90. In the illustrated embodiment, the second bonding wire 90 couples the bond pad 83 to the same contact 24 to which the first bonding wire 70 is attached. This can provide an electrical connection between the first and second microelectronic components 30 and 80. In an alternative embodiment of the invention, the second bonding wire 90 is attached to a contact (not shown) other than the contact 24 to which the first bonding wire 70 is attached.

The second bonding wire 90 may be attached to the second microelectronic component 80 and the substrate 20 in any desired fashion. In the illustrated embodiment, the second microelectronic component 80 includes a conventional, single-layer bond pad 83. Unlike the multilayer bond pad 50 of the first microelectronic component 30, such conventional bond pads 83 are not well suited to stitch bonding, as explained above. As a consequence, the second bonding wire 90 in the illustrated embodiment is attached to the bond pad 83 of the second microelectronic component 80 by a ball bond 92. The second end of the bonding wire 90 is attached to the contact 24 of the substrate 20 by a stitch bond 94. Using this conventional "downhill" bonding requires that the second bonding wire 90 extend outwardly from the active surface 82 of the second microelectronic component 80 to a minimum loop height $H_L$ of at least about 6 mils (about 152 μm) to avoid undue stress on the bail bond 92. As suggested in FIG. 6, this minimum loop height $H_L$ is significantly greater than the maximum height H of the first bonding wire 70 above the active surface 32 of the first microelectronic component 30. It is anticipated, though, that the minimum loop height $H_L$ will be less than the total thickness of the first microelectronic component and the adhesive 38. In a stacked microelectronic device assembly 110 such as that shown if FIG. 6, the loop height of the second bonding wire 90 is not expected to increase the total height or profile of the microelectronic device assembly 110.

In forming the microelectronic device assembly 110 of FIG. 6, the second microelectronic component 80 may be wire bonded to the substrate 20 with the second bonding wire 90 before the first bonding wire 70 is used to wire bond the substrate 20 to the first microelectronic component 30. In the illustrated embodiment this is accomplished by first attaching the second bonding wire 90 to the bond pad 83 using a ball bond 92, then attaching the second end of the wire 90 to the contact 24 with a stitch bond 94. In one embodiment of the invention, each of a plurality of bond pads 83 of the second microelectronic component 80 are coupled to a series of contacts 24 on the substrate 20 using a plurality of second bonding wires 90. Thereafter, each of a plurality of multi-layer bond pads 50 carried by the first microelectronic component 30 may be coupled to the substrate 20 using a plurality of the first bonding wires 70, as outlined above.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A microelectronic device assembly, comprising:
    a substrate having a plurality of contacts carried on a contact surface;
    a semiconductor carried by the substrate, the semiconductor comprising a back surface, a front surface carrying a plurality of multi-layered bond pads, and an integrated circuit, the semiconductor back surface being attached to the contact surface of the substrate and the semiconductor, front surface being spaced outwardly from the contact surface, each of the multi-layered bond pads comprising a bond pad base, an outer bond layer, and a conductive intermediate layer between the bond pad base and the outer bond layer, both the bond pad base and the integrated circuit comprising a first metal selected from the group consisting of aluminum and copper, the intermediate layer comprising a second metal, and the outer bond layer comprising a third metal, the first, second, and third metals being different from one another; and
    a plurality of bonding wires comprising the third metal, a first end of each bonding wire being ball bonded to one of the contacts and a second end of each bonding wire being stitch bonded to the outer bond layer of one of the multi-layered bond pads.

2. The microelectronic device assembly of claim 1 wherein the second metal comprises titanium, tungsten, chromium, or an alloy of titanium, tungsten, or chromium.

3. The microelectronic device assembly of claim 1 wherein an outer surface of the outer bond layer is spaced no more than 1 μm from the bond pad base.

4. The microelectronic device assembly of claim 1 wherein the second end of each bonding wire is wedge bonded to the outer bond layer of one of the multi-layered bond pads.

5. The microelectronic device assembly of claim 1 wherein the substrate comprises a flexible substrate.

6. The microelectronic device assembly of claim 1 wherein the bond pad base has an effective surface area, the outer bond layer having an outer surface having a surface area which is no less than the effective surface area of the bond pad base.

7. The microelectronic device assembly of claim 1 further comprising an abrasion-resistant passivation layer carried by the front surface of the die.

8. The microelectronic device assembly of claim 1 wherein the bonding wire has a maximum height of no greater than 3 mils outwardly from the front surface of the die.

9. The microelectronic device assembly of claim 1 wherein the third metal comprises gold.

10. The microelectronic device assembly of claim 9 wherein each of the bonding wires comprises a gold alloy.

11. The microelectronic device assembly of claim 1 further comprising a passivation layer carried by the front surface of the die, the passivation layer having a plurality of passivation openings therein, each of the passivation openings being aligned with of one of the bond pad bases.

12. The microelectronic device assembly of claim 11 wherein each multi-layered bond pad substantially fills the passivation opening with which it is aligned.

13. The microelectronic device assembly of claim 11 wherein the outer bond layer of each multi-layered bond pad extends outwardly beyond an outer surface of the passivation layer.

14. The microelectronic device assembly of claim 11 wherein the outer bond layer of each multi-layered bond pad extends laterally beyond a periphery of the passivation opening with which the bond pad is aligned.

15. A microelectronic device assembly, comprising:
 a substrate having a first contact and a second contacts;
 a first microelectronic component carried by the substrate the first microelectronic component carrying a plurality of first bond pads, each of the first bond pads comprising a bond pad base comprising aluminum, an outer bond layer comprising gold, and an intermediate layer between the bond pad base and the outer bond layer, the intermediate layer comprising a metal selected from the group consisting of titanium, tungsten, and chromium; and
 a second microelectronic component carried by the substrate, the second microelectronic component including a second bond pad on an active surface;
 a first bonding wire and a second bonding wires, the first bonding wire comprising gold, a first end of the first bonding wire being bonded to the first contacts and a second end of the first bonding wire being stitch bonded to the outer bond layer of one of the first bond pads, and a first end of the second bonding wire being bonded to the second contact and a second end of the second bonding wire being ball bonded to the second bond pad.

16. The microelectronic device assembly of claim 15 wherein an outer surface of the outer bond layer is spaced no more than 1 mil from the bond pad base.

17. The microelectronic device assembly of claim 15 wherein the bond pad base has an effective surface area, the outer bond layer having an outer surface having a surface area which is no less than the effective surface area of the bond pad base.

18. The microelectronic device assembly of claim 15 wherein the first bonding wire has a maximum height of no greater than 3 mils with respect to an active surface of the first microelectronic component, but the second bonding wire has a maximum height of greater than 3 mils with respect to an active surface of the second microelectronic component.

19. The microelectronic device assembly of claim 15 wherein the first microelectronic component is attached to the second microelectronic component and the second microelectronic component is attached to the substrate.

20. The microelectronic device assembly of claim 15 wherein the second bonding wire has a loop height outwardly from the second microelectronic component that is no greater than a height of an active surface of the first microelectronic component outwardly from the second microelectronic component.

21. The microelectronic device assembly of claim 15 wherein second bonding wire has a loop height outwardly from the second microelectronic component that is greater than a maximum height of the first bonding wire with respect to an active surface of the first microelectronic component.

22. The microelectronic device assembly of claim 15 wherein the outer bond layer extends laterally beyond a periphery of the effective area of the bond pad base.

23. The microelectronic device assembly of claim 15 further comprising a passivation layer carried by an active surface of the first microelectronic component, the passivation layer having a plurality of passivation openings therein aligned with the first bond pad bases, wherein each bond pad base extends laterally beyond a periphery of the passivation opening with which it is aligned.

24. The microelectronic device assembly of claim 15 further comprising a passivation layer carried by an active surface of the first microelectronic component, the passivation layer having a plurality of passivation openings therein, each of the passivation openings being aligned with one of the bond pad bases.

25. The microelectronic device assembly of claim 24 wherein the outer bond layer of each first bond pad extends laterally beyond a periphery of the passivation opening with which the first bond pad is aligned.

26. A microelectronic device assembly, comprising:
 a semiconductor die carrying a passivation layer and having a multi-layered bond ad the passivation layer having an opening therein, the multi-layered bond pad comprising a bond pad base, an outer bond layer, and a conductive intermediate layer between the bond pad base and the outer bond layer, the bond pad base comprising aluminum and having an outer periphery that extends beyond a periphery of the opening in the passivation layer, the outer bond layer comprising a first metal and having an outer periphery that extends beyond the periphery of the opening in the passivation layer; and
 a bonding wire having a first end stitch bonded to the outer bond layer of the multi-layered bond pad, the bonding wire being formed of a conductive metal comprising the first metal.

27. The microelectronic device assembly of claim 26 wherein the bonding wire has a second end ball bonded to a contact of a substrate.

28. The microelectronic device assembly of claim 26 wherein the bond pad base has an effective surface area bounded by the periphery of the opening in the passivation layer, the outer bond layer having an outer surface having a surface area which is no less than the effective surface area of the bond pad base.

29. The microelectronic device assembly of claim 26 wherein the intermediate layer of the multi-layered bond pad extends outwardly beyond an outer surface of the passivation layer.

30. The microelectronic device assembly of claim 26 wherein the semiconductor die has a plurality of multi-layered bond pads.

31. The microelectronic device assembly of claim 30 wherein a separate bonding wire is stitch bonded to each of the multi-layered bond pads.

32. The microelectronic device assembly of claim 26 wherein the first metal comprises gold.

33. The microelectronic device assembly of claim 32 wherein the conductive metal comprises a gold alloy.

34. The microelectronic device assembly of claim 26 wherein the opening is a passivation, openings, and the passivation layer has a plurality of passivation openings, and wherein the semiconductor die has a plurality of multi-layered bond pads, each of the passivation openings being aligned with of one of the bond pad bases.

35. The microelectronic device assembly of claim 34 wherein each multi-layered bond pad substantially fills the passivation opening with which it is aligned.

36. A microelectronic device assembly, comprising:
   a flexible substrate having a substrate contact;
   a semiconductor die having electronic circuitry and a bond pad base electrically coupled to the electronic circuitry, the circuitry and the bond pad base comprising a first metal selected from the group consisting of copper and aluminum, the bond pad base having an effective surface;
   a conductive intermediate layer covering the effective surface of the bond pad base, the intermediate layer comprising a second metal which is different from the first metal;
   an outer bond layer applied on the intermediate layer, the outer bond layer having an external surface which is no smaller than the effective surface of the bond pad base, the outer bond layer comprising a third metal which is different from the first metal and from the second metal; and
   a bonding wire which has a first end stitch bonded to the outer bond layer and extending laterally away from the semiconductor die to couple the semiconductor die to the substrate contact, the bonding wire being formed of a metal which comprises the third metal.

37. The microelectronic device assembly of claim 36 wherein the first metal is selected from the group consisting of aluminum and copper.

38. The microelectronic device assembly of claim 36 wherein the bond pad base is carried adjacent an active surface of the semiconductor die, the bonding wire having a maximum height of no greater than 3 mils with respect to the active surface of the semiconductor die.

39. The microelectronic device assembly of claim 36 wherein the outer bond layer extends laterally beyond a periphery of the effective area of the bond pad base.

40. The microelectronic device assembly of claim 36 wherein the semiconductor die further comprises a passivation layer which surrounds the effective surface of the bond pad base.

41. The microelectronic device assembly of claim 36 wherein the semiconductor die further comprises a passivation layer which surrounds the effective surface of the bond pad base, the outer bond layer extending laterally outwardly over the passivation layer.

42. The microelectronic device assembly of claim 41 wherein the intermediate layer extends between the passivation layer and the outer bond layer.

43. The microelectronic device assembly of claim 36 wherein the second metal limits diffusion of the third metal into the first metal.

44. The microelectronic device assembly of claim 43 wherein the second metal is selected from the group consisting of titanium, tungsten, and chromium.

45. The microelectronic device assembly of claim 44 wherein the intermediate layer comprises an alloy of the second metal.

* * * * *

UNITED STATES PATENT AND TRADEMARK OFFICE
CERTIFICATE OF CORRECTION

PATENT NO.    : 6,650,013 B2
DATED         : November 18, 2003
INVENTOR(S)   : Leng Nam Yin et al.

Page 1 of 1

It is certified that error appears in the above-identified patent and that said Letters Patent is hereby corrected as shown below:

Column 2,
Line 63, "formed" should be -- form --;
Line 66, "wires" should be -- wire --;

Column 4,
Line 32, insert comma between "properties" and "as";

Column 8,
Line 35, delete comma between "semiconductor" and "front";

Column 9,
Line 29, "contacts" should be -- contact --;
Line 30, insert comma between "substrate" and "the";
Line 42, "wires" should be -- wire --;
Line 44, "contacts" should be -- contact --;

Column 10,
Line 36, "ad" should be -- pad, --.

Signed and Sealed this

Twenty-fifth Day of May, 2004

JON W. DUDAS
*Acting Director of the United States Patent and Trademark Office*